(12) United States Patent
Hsieh et al.

(10) Patent No.: US 10,504,837 B2
(45) Date of Patent: Dec. 10, 2019

(54) SEMICONDUCTOR DEVICE INCLUDING A CONDUCTIVE FEATURE OVER AN ACTIVE REGION

(71) Applicant: Taiwan Semiconductor Manufacturing Company, Ltd., Hsin-Chu (TW)

(72) Inventors: Tung-Heng Hsieh, Zhudong Town (TW); Hui-Zhong Zhuang, Kaohsiung (TW); Chung-Te Lin, Tainan (TW); Ting-Wei Chiang, Taipei (TW); Sheng-Hsiung Wang, Zhubei (TW); Li-Chun Tien, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 284 days.

(21) Appl. No.: 15/231,135

(22) Filed: Aug. 8, 2016

(65) Prior Publication Data
US 2016/0343656 A1    Nov. 24, 2016

Related U.S. Application Data

(62) Division of application No. 14/515,276, filed on Oct. 15, 2014, now Pat. No. 9,412,700.

(51) Int. Cl.
*H01L 23/52* (2006.01)
*H01L 23/528* (2006.01)
(Continued)

(52) U.S. Cl.
CPC ...... *H01L 23/528* (2013.01); *H01L 21/76895* (2013.01); *H01L 21/76897* (2013.01);
(Continued)

(58) Field of Classification Search
CPC ..... H01L 21/823431; H01L 21/823814; H01L 21/823821; H01L 21/02532;
(Continued)

(56) References Cited

U.S. PATENT DOCUMENTS 4,894,693 A    1/1990  Tigelaar et al.
5,108,945 A *  4/1992  Matthews ......... H01L 21/28211
                                              148/DIG. 136
(Continued)

FOREIGN PATENT DOCUMENTS

CN            86103067 A      7/1987
CN           102820326 A     12/2012

*Primary Examiner* — Mohammed Shamsuzzaman
(74) *Attorney, Agent, or Firm* — Slater Matsil, LLP

(57) ABSTRACT

A semiconductor device includes a substrate having an active region, a first gate structure over a top surface of the substrate, a second gate structure over the top surface of the substrate, a pair of first spacers on each sidewall of the first gate structure, a pair of second spacers on each sidewall of the second gate structure, an insulating layer over at least the first gate structure, a first conductive feature over the active region and a second conductive feature over the substrate. Further, the second gate structure is adjacent to the first gate structure and a top surface of the first conductive feature is coplanar with a top surface of the second conductive feature.

20 Claims, 12 Drawing Sheets

(51) Int. Cl.
*H01L 23/535* (2006.01)
*H01L 27/088* (2006.01)
*H01L 29/40* (2006.01)
*H01L 21/768* (2006.01)
*H01L 23/485* (2006.01)
*H01L 21/8234* (2006.01)

(52) U.S. Cl.
CPC .... *H01L 21/823475* (2013.01); *H01L 23/485* (2013.01); *H01L 23/535* (2013.01); *H01L 27/088* (2013.01); *H01L 29/401* (2013.01); *H01L 2924/0002* (2013.01)

(58) Field of Classification Search
CPC ..... H01L 21/823864; H01L 21/823437; H01L 21/823807; H01L 21/845; H01L 21/30604; H01L 21/823418; H01L 21/26513; H01L 21/32139
USPC .......................... 438/259, 201, 299, 585, 275
See application file for complete search history.

(56) References Cited

U.S. PATENT DOCUMENTS

| | | | | |
|---|---|---|---|---|
| 5,731,219 | A | * | 3/1998 | Ikeda ...................... H01L 27/11 257/E27.098 |
| 2012/0313163 | A1 | | 12/2012 | Fukui et al. |
| 2016/0005851 | A1 | * | 1/2016 | Song .................... H01L 27/088 257/401 |
| 2016/0099243 | A1 | * | 4/2016 | Azmat .................. H01L 27/088 257/368 |

* cited by examiner

SEMICONDUCTOR DEVICE INCLUDING A CONDUCTIVE FEATURE OVER AN ACTIVE REGION

PRIORITY CLAIM AND CROSS-REFERENCE

This application is a divisional of U.S. patent application Ser. No. 14/515,276, entitled "Semiconductor Device and Method of Manufacturing Semiconductor Device," filed on Oct. 15, 2014, U.S. Pat. No. 9,412,700, which application is hereby incorporated herein by reference.

BACKGROUND

The recent trend in miniaturizing integrated circuits (ICs) has resulted in smaller devices which consume less power yet provide more functionality at higher speeds. For one or more of these advantages to be realized, various developments in IC design and/or manufacture are considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
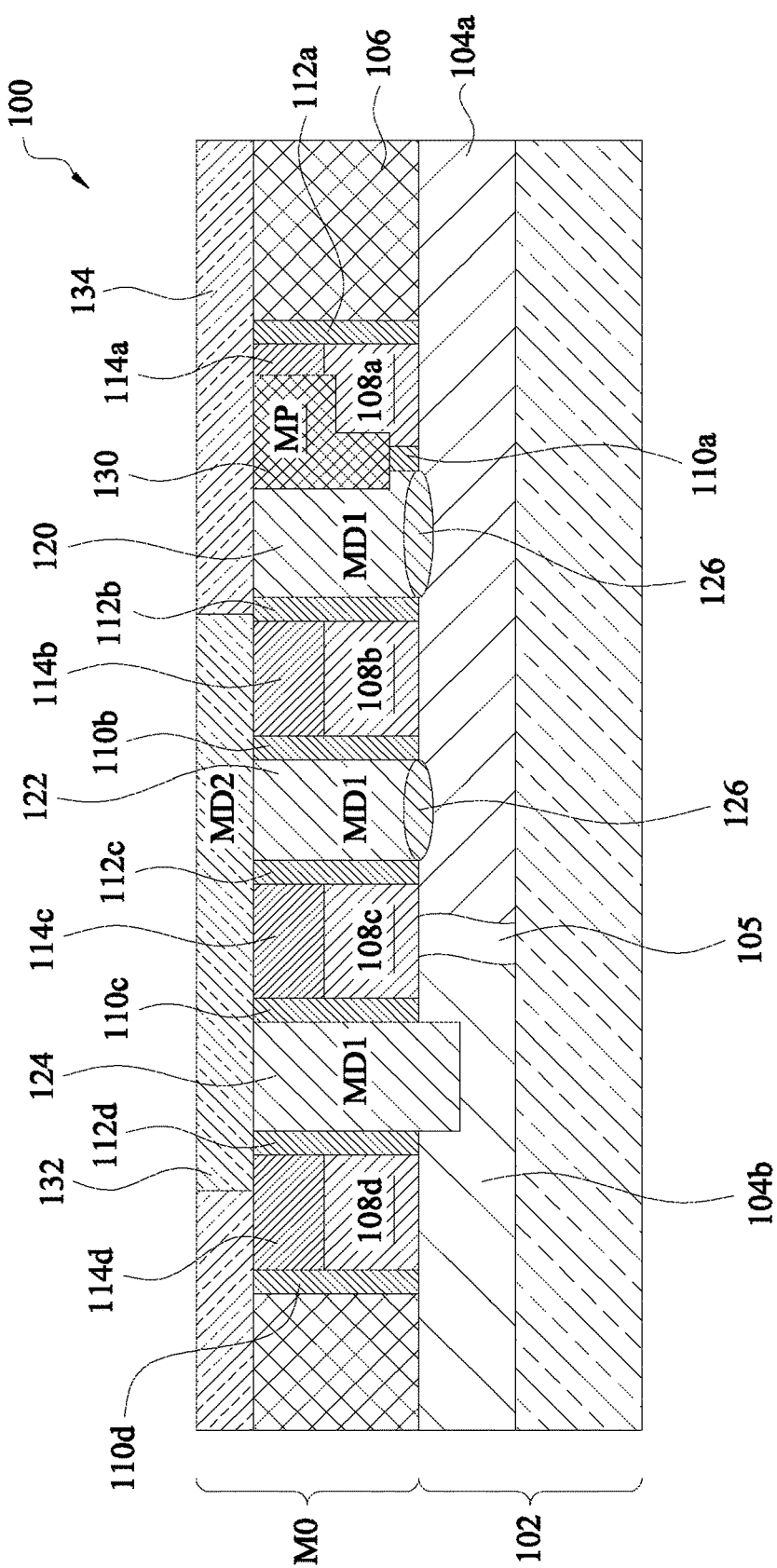
FIG. 1 is a schematic cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

FIG. 1 is a schematic cross-sectional view of a semiconductor device 100 in accordance with some embodiments. The semiconductor device 100 includes a substrate 102, an inter-layer dielectric (ILD) layer 106, gate structures 108a, 108b, 108c and 108d, a pair of first spacers 110a and 112a, a pair of second spacers 110b and 112b, a pair of third spacers 110c and 112c, a pair of fourth spacers 110d and 112d, insulating layers 114a, 114b, 114c and 114d, first conductive features 120, 122 and 124, silicided regions 126, a second conductive feature 130, a third conductive feature 132 and ILD layer 134.

The semiconductor device 100 includes active elements and/or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drains. Examples of passive elements include, but are not limited to, capacitors, inductors, fuses, and resistors. In the example configuration illustrated in FIG. 1, the semiconductor device 100 is a portion of a transistor. The source feature (not shown), the drain feature (not shown), the channel feature (not shown) and the gate structure (e.g., gate structure 108a, 108b, 108c or 108d) together define the transistor.

The substrate 102 comprises bulk silicon, a semiconductor wafer, a silicon-on-insulator (SOI) substrate, or a silicon germanium substrate. Other semiconductor materials including group III, group IV, and group V elements are within the scope of various embodiments.

The substrate 102 comprises an active region 104a and one or more isolation structures 104b. The active region 104a is isolated from other elements of the semiconductor device 100 by one or more isolation structures 104b. The symbol 105 schematically illustrates that the described structures (e.g., active region 104a or isolation structure 104b) are arranged in various regions of semiconductor device 100 which are not homogeneous throughout in one or more embodiments.

The active region 104a is a doped region of the substrate 102 and includes a source feature (not shown), a drain feature (not shown), and a channel feature (not shown) positioned between the source feature and drain feature. Examples of materials of the active region 104a include, but are not limited to, semiconductor materials doped with various types of p-dopants and/or n-dopants. The active region 104a is referred to herein as an oxide definition (OD) area or pattern.

The one or more isolation structures 104b isolate the active region 104a from other portions of the semiconductor device 100. In some embodiments, the one or more isolation structures 104b are embedded in the substrate 102. In some embodiments, the one or more isolation structures 104b are over the substrate 102. In some embodiments, the one or more isolation structures 104b are shallow trench isolation (STI) structures.

The ILD layer 106 is over the active region 104a or the isolation structure 104b. The ILD layer 106 is also referred to herein as an ILD0 layer," i.e. inter-layer dielectric-zero (ILD0) layer.

Gate structures 108a, 108b, 108c and 108d are over a top surface of a substrate 102. Gate structures 108a and 108b are over active region 104a. Gate structure 108c is over symbol 105. In some embodiments, gate structure 108c is over active region 104a. In some embodiments, gate structure 108c is over isolation structure 104b. Gate structure 108d is over isolation structure 104b. The illustrations shown in FIG. 1 are exemplary, and the number of gate structures over the active region 104a or the one or more isolation structures varies. In some embodiments, gate structures 108a and 108b are over a channel region (not shown). In some embodiments, the gate structures 108a, 108b, 108c and 108d are referred to herein as a poly (PO) pattern and are schematically illustrated in the drawings with the label "PO." Examples of materials of gate structure 108a, 108b, 108c or 108d include, but are not limited to, metal and polysilicon. In some embodiments, gate structure 108a, 108b, 108c or 108d comprises a dummy gate. In some embodiments, gate structure 108a, 108b, 108c or 108d comprises a metal gate. Gate structures 108a, 108b, 108c and 108d are adjacent with each other. In some embodiments, an adjacent gate structure is a gate structure within a predetermined distance of other gate structures in the semiconductor device 100. In some embodiments, a portion of the gate structure 108a is removed.

A pair of first spacers 110a and 112a is on opposite sidewalls of the gate structure 108a. The pair of first spacers 110a and 112a comprises, for instance, a dielectric layer. A height of the first spacer 110a is less than the height of the first spacer 112a. In some embodiments, the height of the first spacer 112a is greater than the height of the gate structure 108a. In some embodiments, the top surface of the first sidewall spacer 110a is not coplanar with the top surface of the first sidewall spacer 112a.

A pair of second spacers 110b and 112b is on opposite sidewalls of the gate structure 108b. The pair of second spacers 110b and 112b comprises, for instance, a dielectric layer. In some embodiments, the height of the second spacer 110b or 112b is greater than the height of the gate structure 108b.

A pair of third spacers 110c and 112c is on opposite sidewalls of the gate structure 108c. The pair of third spacers 110c and 112c comprises, for instance, a dielectric layer. In some embodiments, the height of the third spacer 110c or 112c is greater than the height of the gate structure 108c.

A pair of fourth spacers 110d and 112d is on opposite sidewalls of the gate structure 108d. The pair of fourth spacers 110d and 112d comprises, for instance, a dielectric layer. In some embodiments, the height of the fourth spacer 110d or 112d is greater than the height of the gate structure 108d.

Insulating layer 114a is over gate structure 108a. In some embodiments, the height of insulating layer 114a is substantially equal to the height of the first spacer 112a. In some embodiments, the top surface of insulating layer 114a is substantially coplanar with the top surface of the first spacer 112a. In some embodiments, a portion of the insulating layer 114a is removed. In some embodiments, the insulating layer 114a comprises a hard mask.

Insulating layer 114b is over gate structure 108b. In some embodiments, the height of insulating layer 114b is substantially equal to the height of the second spacer 110b or 112b. In some embodiments, the top surface of insulating layer 114b is substantially coplanar with the top surface of the second spacer 110b or 112b. In some embodiments, a portion of the insulating layer 114b is removed. In some embodiments, the insulating layer 114b comprises a hard mask. In some embodiments, the insulating layer 114b is embedded between the pair of second spacers 110b and 112b.

Insulating layer 114c is over gate structure 108c. In some embodiments, the height of insulating layer 114c is substantially equal to the height of the third spacer 110c or 112c. In some embodiments, the top surface of insulating layer 114c is substantially coplanar with the top surface of the third spacer 110c or 112c. In some embodiments, a portion of the insulating layer 114c is removed. In some embodiments, the insulating layer 114c comprises a hard mask. In some embodiments, the insulating layer 114c is embedded between the pair of third spacers 110c and 112c.

Insulating layer 114d is over gate structure 108d. In some embodiments, the height of insulating layer 114d is substantially equal to the height of the fourth spacer 110d or 112d. In some embodiments, the top surface of insulating layer 114d is substantially coplanar with the top surface of the fourth spacer 110d or 112d. In some embodiments, a portion of the insulating layer 114d is removed. In some embodiments, the insulating layer 114d comprises a hard mask. In some embodiments, the insulating layer 114d is embedded between the pair of fourth spacers 110d and 112d.

First conductive feature 120, 122 or 124 is over semiconductor device 100 to provide electrical connections to the semiconductor device 100.

First conductive feature 120 is embedded in the ILD layer 106 to provide electrical connection to the gate structure 108a and the corresponding exposed source/drain features (e.g., active region 104a) of gate structure 108a or 108b. In some embodiments, the top surface of the first conductive feature 120 is coplanar with a top surface of the insulating layer 114a, 114b, 114c or 114d. In some embodiments, the first conductive feature 120 has a varied thickness. In some embodiments, the first conductive feature 120 has a tapered shape. In some embodiments, the first conductive feature 120 has an L-shape.

First conductive feature 122 is embedded in the ILD layer 106 to provide electrical connection to the exposed source/drain features (e.g., active region 104a) of gate structure 108b or 108c. In some embodiments, the top surface of the first conductive feature 122 is coplanar with a top surface of the insulating layer 114a, 114b, 114c or 114d. First conductive features 120, 122 and 124 are over the active region 104a, and belong to a lower conductive layer referred to herein as MD1 layer or pattern. The MD1 layer is a metal-zero-over-oxide layer and is schematically illustrated in the drawings with the label "MD1."

First conductive feature 124 extends at least partially into the isolation structure 104b. First conductive feature 124 is over the isolation structure 104b, and belongs to a lower conductive layer referred to herein as MD1 layer or pattern. In some embodiments, the top surface of the first conductive feature 124 is coplanar with a top surface of the insulating layer 114a, 114b, 114c or 114d. In some embodiments, first conductive feature 124 is embedded in the isolation structure 104b.

Silicided regions 126 are between the first conductive features 120 and 122 and the top surface of the active region 104a (e.g., source/drain features) of semiconductor device 100.

Second conductive feature 130 is over and electrically coupled to the corresponding first conductive feature 120. Second conductive feature 130 is referred to herein as a metal-zero-over-polysilicon (MP) layer or pattern and is schematically illustrated in the drawings with the label "MP." In some embodiments, the second conductive feature 130 is in direct electrical contact with the gate structure 108a. In some embodiments, the second conductive feature 130 is in direct electrical contact with the corresponding first conductive feature 120. The illustrations shown in FIG. 1 are exemplary, and the number of second conductive features 130 varies. In some embodiments, second conductive feature 130 is electrically connected to more than one first conductive feature. In some embodiments, the top surface of the first conductive feature 120 is coplanar with the top surface of the second conductive feature 130. In some embodiments, the second conductive feature 130 has a varied thickness. In some embodiments, the second conductive feature 130 has a tapered shape. In some embodiments, the second conductive feature 130 has an L-shape. In some embodiments, the second conductive feature 130 has a U-shape. In some embodiments, a portion of the second conductive feature 130 is embedded in the first conductive feature 120. In some embodiments, a material of the second conductive feature 130 is substantially similar to the material of the first conductive feature 120. In some embodiments, a portion of the second conductive feature 130 is embedded between the first conductive feature 120, the gate structure 108a and the pair of first spacers 110a and 112a. In some embodiments, the second conductive feature 130 is directly on the first spacer 110a. In some embodiments, the second conductive feature 130 is electrically connected to the gate structure 108a.

Third conductive feature 132 is over first conductive features 120, 122 and 124, and second conductive feature 130. Third conductive feature 132 is embedded in ILD layer 134. Third conductive feature 132 belongs to an upper conductive layer referred to herein as MD2 layer or pattern. The MD2 layer is also a metal-zero-over-oxide layer and is schematically illustrated in the drawings with the label "MD2."

Third conductive feature 132 is over the gate structures 108a, 108b, 108c and 108d. In some embodiments, third conductive feature 132 is electrically coupled to the source/drain of gate structure 108b or 108c by first conductive feature 122. In some embodiments, third conductive feature 132 is configured to provide an electrical connection to the first conductive features 120 and 122 or the second conductive feature 130. In some embodiments, third conductive feature 132 is configured to provide an electrical connection to the active region 104a of the semiconductor device 100.

In some embodiments, third conductive feature 132 is configured to provide an electrical connection to one or more isolation regions (e.g., isolation structure 104b) of the semiconductor device 100.

In some embodiments, third conductive feature 132 is electrically coupled to first conductive features 122 or 124. In some embodiments, insulating layers 114b, 114c and 114d electrically insulate the corresponding gate structures 108b, 108c and 108d from the third conductive feature 132. In some embodiments, third conductive feature 132 is over the active region 104a. In some embodiments, third conductive feature 132 is over the isolation structure 104b. The illustrations shown in FIG. 1 are exemplary, and the number of third conductive features 132 varies. In some embodiments, third conductive feature 132 is electrically connected to one or more of the first conductive features 120, 122 and 124. In some embodiments, third conductive feature 132 is electrically connected to one or more second conductive features 130. In some embodiments, third conductive feature 132 is electrically connected to other layers (not shown) in the semiconductor device 100. In some embodiments, the second conductive feature 130 is configured to provide a larger contact area to the gate structure 108a when compared with similar conductive features positioned above the gate structure 108a.

The ILD layer 134 is over the ILD layer 106. The ILD layer 134 is also referred to herein as an "ILD1 layer," i.e. inter-layer dielectric-one (ILD1) layer.

The MP, MD1 and MD2 layers are independently chosen from conductive materials and belong to a first (i.e., lowermost) conductive material layer over the substrate 102 referred to herein as "M0 layer," i.e., metal-zero (M0) layer, which is the lowermost metal layer of the semiconductor device 100. In some embodiments, the MP, MD1 and MD2 layers are metal and belong to first metal layer M0. The M0 layer is schematically illustrated in the drawings with the label "M0." In at least one embodiment, the M0 layer is formed in two steps. For example, in a first step, the lower portion, i.e., the top surface of the MD1 and MP layers, are substantially coplanar with the insulating layers 114a. 114b, 114c and 114d. In a second step, the upper portion, i.e., the MD2 layer, is formed over the corresponding MD1 and MP layers and gate structures 108a, 108b, 108c and 108d. In some embodiments, the M0 layer is referred to as the local interconnect layer.

In some embodiments, one or more of the MD1, MP and MD2 layers provide electrical connections between various elements of the semiconductor device 100 and/or between one or more elements of the semiconductor device 100 and external circuitry. The above-described structure is an example configuration, and other arrangements of electrical connections among elements of the semiconductor device 100 are contemplated in various embodiments. For example, in one or more embodiments, one or more via layers (not shown) are over and connected to the M0 layer. In some embodiments, the one or more via layers (not shown) provide electrical connection to further metal layers (not shown) over the M0 layer.

Figure 2A:
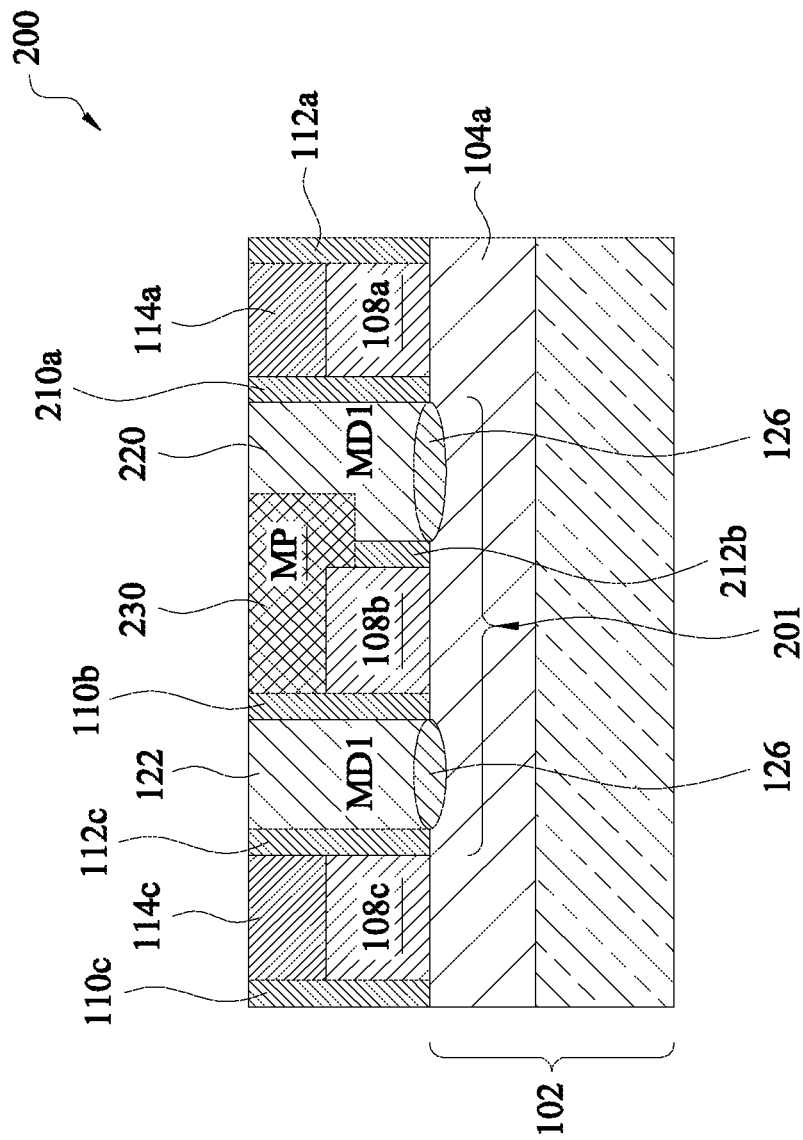
FIG. 2A is a schematic cross-sectional view of a semiconductor device in accordance with one or more embodiments.

FIG. 2A is a schematic cross-sectional view of a semiconductor device 200 in accordance with one or more embodiments. Semiconductor device 200 is an embodiment of semiconductor device 100 shown in FIG. 1 with similar elements. As shown in FIG. 2A, similar elements have a same reference number as shown in FIG. 1. In comparison with FIG. 1, the semiconductor device 200 of FIG. 2A does not include isolation structure 104b, ILD 106, gate structure 108d, pair of fourth spacers 110d and 112d, insulating layers 114*b* and 114*d*, first conductive feature 124, second conductive feature 130 and third conductive feature 132.

In comparison with FIG. 1, the semiconductor device 200 comprises a transistor 201 and a second conductive feature 230. Second conductive feature 230 is an embodiment of second conductive feature 130 shown in FIG. 1. First conductive feature 220 is an embodiment of first conductive feature 120 shown in FIG. 1. First spacer 210*a* is an embodiment of first spacer 110*a* shown in FIG. 1. Second spacer 212*b* is an embodiment of second spacer 112*b* shown in FIG. 1.

Transistor 201 comprises active region 104*a* (which includes a source feature (not shown), a drain feature (not shown), and a channel region (not shown)) and a gate structure 108*b*.

In comparison with FIG. 1, the second conductive feature 230 is electrically connected to the gate structure 108*b*. Second conductive feature 230 is electrically coupled to the corresponding first conductive feature 220. In some embodiments, the second conductive feature 230 is in direct contact with the gate structure 108*b*. While FIG. 2A does not show an insulating layer 114*b* over the gate structure 108*b*, other embodiments exist where a portion of the insulating layer 114*b* is over the gate structure 108*b*, and the second conductive feature 230 is in direct contact with the top surface of the gate structure 108*b* and the remaining portion of the insulating layer 114*b*. In some embodiments, the second conductive feature 230 is in direct electrical contact with the corresponding first conductive feature 220. In some embodiments, the top surface of the first conductive feature 220 is coplanar with the top surface of the second conductive feature 230. In some embodiments, the second conductive feature 230 has a tapered shape. In some embodiments, the second conductive feature 230 has an L-shape. In some embodiments, the second conductive feature 230 has a U-shape. In some embodiments, a portion of the second conductive feature 230 is embedded in the first conductive feature 220. In some embodiments, a portion of the second conductive feature 230 is positioned between the first conductive feature 220, the gate structure 108*b* and the pair of second spacers 210*b* and 212*b*. In some embodiments, a portion of the second conductive feature 230 is embedded in the first conductive feature 220, the gate structure 108*b* and the pair of second spacers 210*b* and 212*b*.

In some embodiments, the second conductive feature 230 is directly on the second spacer 212*b*. In some embodiments, the height of the second spacer 110*b* with respect to the top of substrate 102 is greater than the height of the second spacer 212*b* with respect to the top of substrate 102. In some embodiments, the height of the first spacer 210*a* with respect to the top of substrate 102 is substantially equal to the height of the first spacer 112*a* with respect to the top of substrate 102. In some embodiments, the second conductive feature 230 is configured to provide a larger contact area to the gate structure 108*b* when compared with similar conductive features positioned above the gate structure 108*b*. In some embodiments, a material of the second conductive feature 230 is substantially similar to the material of the first conductive feature 220.

Figure 2B:
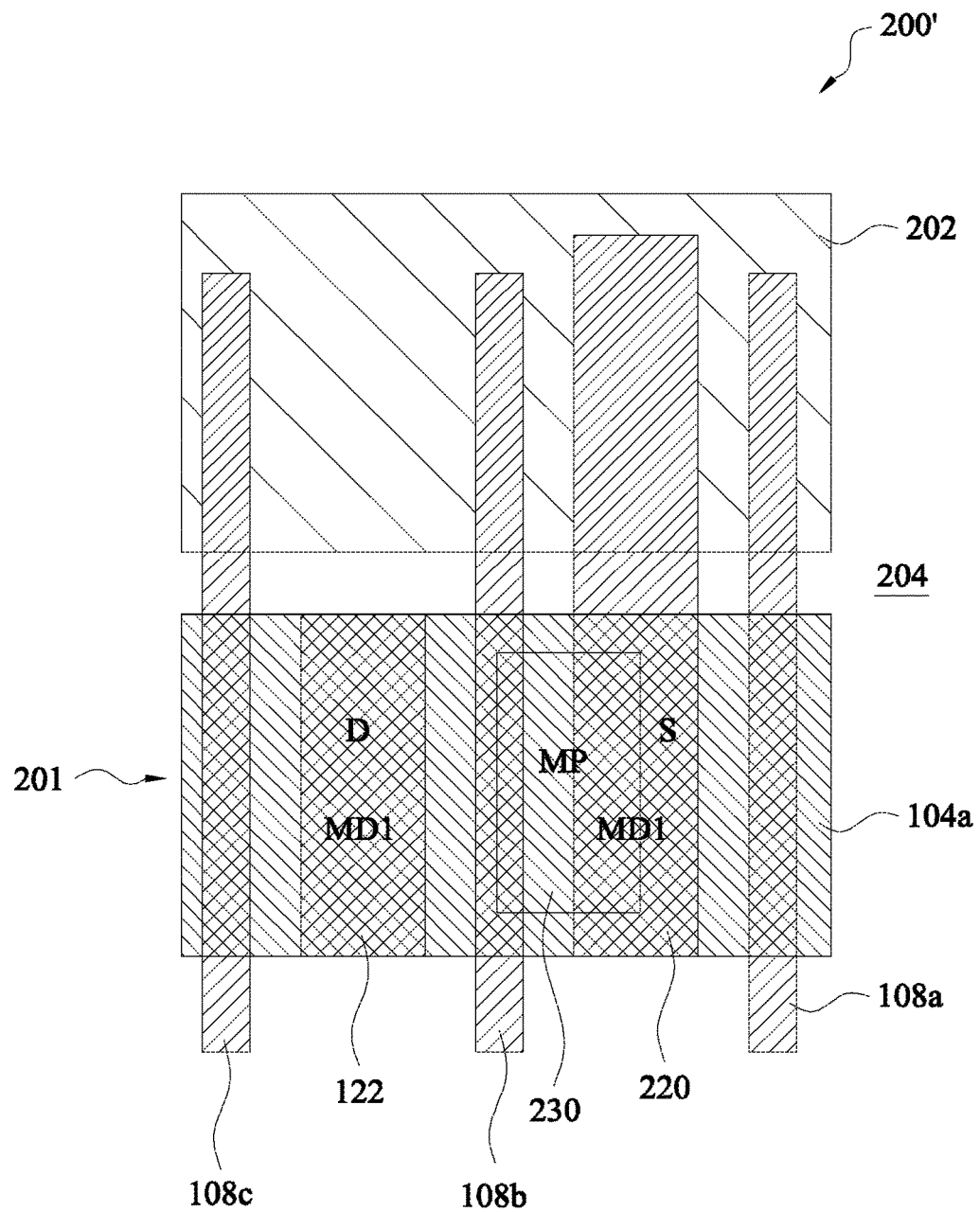
FIG. 2B is a portion of a layout diagram of the semiconductor device shown in FIG. 2A in accordance with one or more embodiments.

FIG. 2B is a portion of a layout diagram 200' of the semiconductor device shown in FIG. 2A in accordance with one or more embodiments. The layout diagram 200' of FIG. 2B is a top-view of a portion of the semiconductor device shown in FIG. 2A, and includes similar elements having a same reference number as shown in FIG. 2A. One or more of the layout patterns described herein are usable to prepare a set of masks usable for manufacturing a memory cell in an integrated circuit. The layout diagram 200' of semiconductor device 200 is a basis to be modified to form other layout structures, such as those described herein, e.g., FIGS. 3B and 4.

Layout diagram 200' includes active region 104*a*, gate structures 108*a*, 108*b* and 108*c*, first conductive features 122 and 220, isolation region 204, second conductive feature 230 and power rail 202. Isolation region 204 is an embodiment of isolation structure 104*b* shown in FIG. 1.

The active region 104*a* extends continuously in the width direction (i.e., in the horizontal direction of FIG. 2B). Active region 104*a* comprises drain feature D and source feature S. Active region 104*a* is electrically isolated from the power rail 202 by isolation region 204.

The gate structures 108*a*, 108*b* and 108*c* extend continuously in the height direction (i.e., in the vertical direction of FIG. 2B). The gate structures 108*a*, 108*b* and 108*c* extend over the active region 104*a* and across the isolation structure 204. The gate structures 108*a*, 108*b* and 108*c* are electrically isolated from each other by isolation region 204.

The power rail 202 extends in the width direction (i.e., in the horizontal direction of FIG. 2B). In some embodiments, the power rail 202 is configured to provide electrical power to the semiconductor device 200.

Transistor device 201 comprises gate structure 108*b*, source feature S and drain feature D. The first conductive feature 122 (e.g., MD1) is electrically connected to the drain feature D of the transistor device 201. The first conductive feature 220 (e.g., MD1) is electrically connected to the source feature S of the transistor device 201. The gate structure 108*b* is electrically connected to the source feature S of the transistor device 201 by second conductive feature 230 (e.g., MP) and first conductive feature 220 (e.g., MD1). In some embodiments, the gate structure 108*b* is directly connected to the second conductive feature 230 (e.g., MP). In some embodiments, the second conductive feature 230 (e.g., MP) is directly connected to the first conductive feature 220 (e.g., MD1). In some embodiments, the first conductive feature 220 (e.g., MD1) is connected to the source feature S.

Figure 3A:
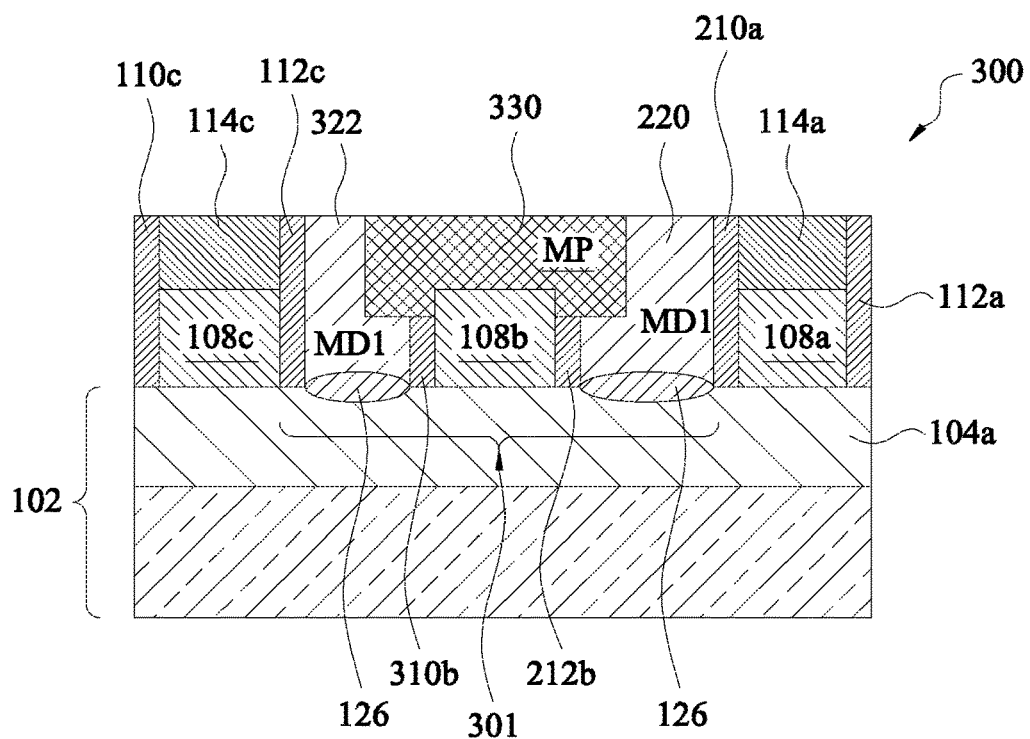
FIG. 3A is a schematic cross-sectional view of a semiconductor device in accordance with one or more embodiments.

FIG. 3A is a schematic cross-sectional view of a semiconductor device 300 in accordance with one or more embodiments. Semiconductor device 300 is an embodiment of semiconductor device 200 shown in FIG. 2A with similar elements. As shown in FIG. 3A, similar elements have a same reference number as shown in FIG. 2A.

In comparison with FIG. 1, the semiconductor device 200 comprises a transistor 301, a second conductive feature 230 and second spacer 310*b*. Second conductive feature 330 is an embodiment of second conductive feature 230 shown in FIG. 2A. Second spacer 310*b* is an embodiment of first spacer 110*a* shown in FIG. 2A.

Transistor 301 comprises active region 104*a* (which includes a source feature (not shown), a drain feature (not shown), and a channel region (not shown)) and a gate structure 108*b*.

The second conductive feature 230 is electrically connected to the gate structure 108*b*. Second conductive feature 230 is electrically coupled to the corresponding first conductive features 220 and 322. In some embodiments, the second conductive feature 330 is in direct contact with the gate structure 108*b*. In some embodiments, the second conductive feature 330 is in direct electrical contact with the corresponding first conductive features 220 and 322. In some embodiments, the top surface of the first conductive feature 220 or 322 is coplanar with the top surface of the second conductive feature 330. In some embodiments, the second conductive feature 330 has a tapered shape. In some embodiments, the second conductive feature 330 has an L-shape. In some embodiments, the second conductive feature 330 has a U-shape. In some embodiments, a portion of the second conductive feature 330 is embedded in the first conductive feature 220 or 322. In some embodiments, a portion of the second conductive feature 330 is positioned between the first conductive feature 220, the gate structure 108b, the pair of second spacers 310b and 212b and the first conductive feature 322. In some embodiments, a portion of the second conductive feature 330 is embedded in the first conductive feature 220 or 322, the gate structure 108b and the pair of second spacers 310b and 212b. In some embodiments, the second conductive feature 330 is directly on the second spacer 212b or 310b. In some embodiments, the height of the second spacer 310b is substantially equal to the height of the second spacer 212b. In some embodiments, the second conductive feature 330 is configured to provide a larger contact area to the gate structure 108b when compared with similar conductive features positioned above the gate structure 108b. In some embodiments, a material of the second conductive feature 330 is substantially similar to the material of the first conductive feature 220 or 322.

Figure 3B:
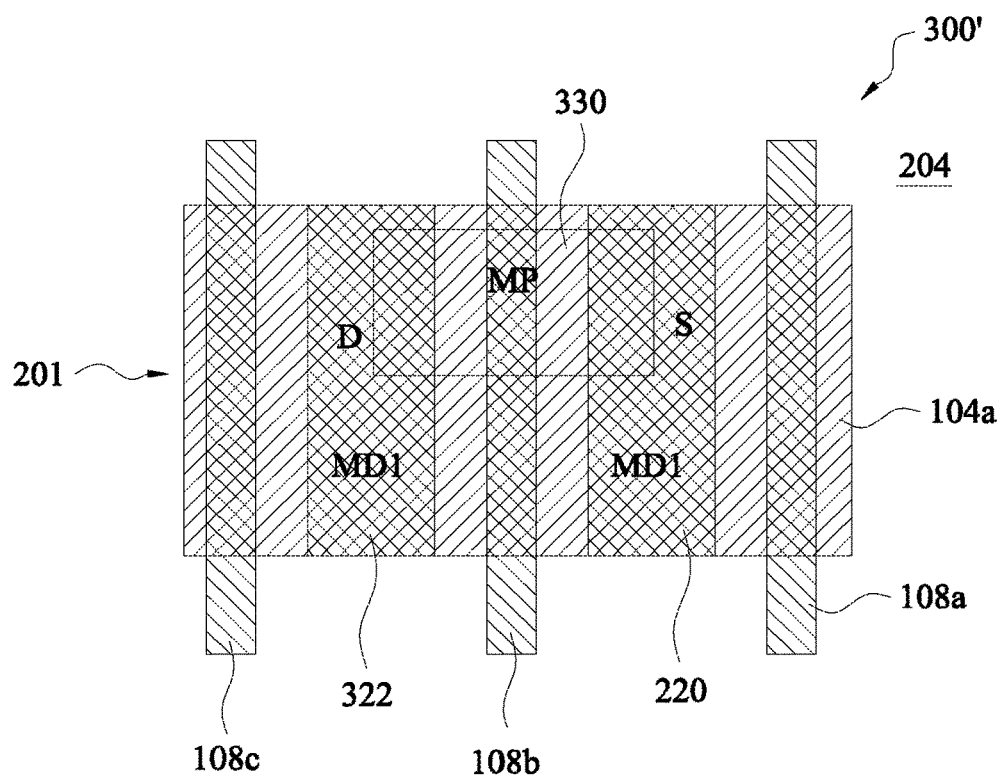
FIG. 3B is a portion of a layout diagram of the semiconductor device shown in FIG. 3A in accordance with one or more embodiments.

FIG. 3B is a portion of a layout diagram 300' of the semiconductor device shown in FIG. 3A in accordance with one or more embodiments. The layout diagram 300' of FIG. 3B is a top-view of a portion of the semiconductor device shown in FIG. 3A. The layout diagram 300' of FIG. 3B is a top-view of a portion of the semiconductor device shown in FIG. 3A, and includes similar elements having a same reference number as shown in FIG. 3A. One or more of the layout patterns described herein are usable to prepare a set of masks usable for manufacturing a memory cell in an integrated circuit. The layout diagram 300' of semiconductor device 300 is a basis to be modified to form other layout structures, such as those described herein, e.g., FIGS. 2B and 4.

Layout diagram 300' is an embodiment of layout diagram 200' shown in FIG. 2B with similar elements. As shown in FIG. 3B, similar elements have a same reference number as shown in FIG. 2B.

Layout diagram 300' includes active region 104a, gate structures 108a, 108b and 108c, first conductive features 322 and 220, isolation region 204, second conductive feature 330. Isolation region 204 is an embodiment of isolation structure 104b shown in FIG. 1.

The active region 104a extends continuously in the width direction (i.e., in the horizontal direction of FIG. 3B). Active region 104a comprises drain feature D and source feature S. Active region 104a is electrically isolated from other portions of semiconductor device 300 by isolation region 204.

The gate structures 108a, 108b and 108c extend continuously in the height direction (i.e., in the vertical direction of FIG. 3B). The gate structures 108a, 108b and 108c extend over the active region 104a and across the isolation structure 204. The gate structures 108a, 108b and 108c are electrically isolated from each other by isolation region 204.

Transistor device 301 comprises gate structure 108b, source feature S and drain feature D. The first conductive feature 322 (e.g., MD1) is electrically connected to the drain feature D of the transistor device 201. The gate structure 108b is electrically connected to the drain feature D of the transistor device 301 by second conductive feature 330 (e.g., MP) and first conductive feature 322 (e.g., MD1). In some embodiments, the gate structure 108b is directly connected to the second conductive feature 330 (e.g., MP). In some embodiments, the second conductive feature 330 (e.g., MP) is directly connected to the first conductive feature 322 (e.g., MD1). In some embodiments, the first conductive feature 322 (e.g., MD1) is connected to the drain feature D.

The first conductive feature 220 (e.g., MD1) is electrically connected to the source feature S of the transistor device 301. The gate structure 108b is electrically connected to the source feature S of the transistor device 301 by second conductive feature 330 (e.g., MP) and first conductive feature 220 (e.g., MD1). In some embodiments, the second conductive feature 330 (e.g., MP) is directly connected to the first conductive feature 220 (e.g., MD1). In some embodiments, the first conductive feature 220 (e.g., MD1) is connected to the source feature S.

Figure 4A:
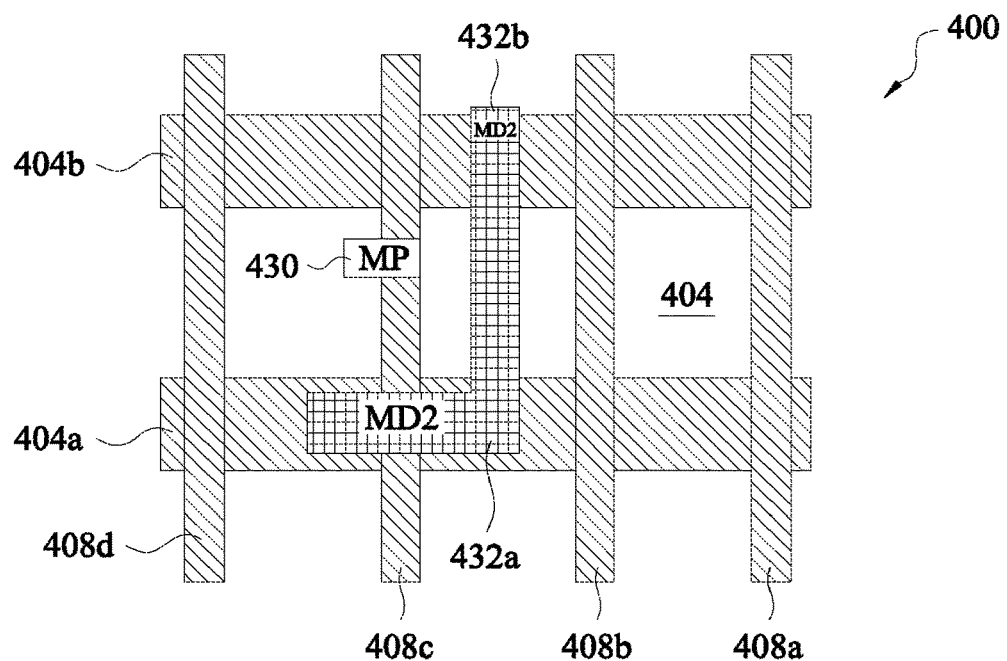
FIG. 4A is a portion of a layout diagram of a semiconductor device in accordance with one or more embodiments.

FIG. 4A is a portion of a layout diagram 400 of a semiconductor device in accordance with one or more embodiments. The layout diagram 400 of FIG. 4A is an embodiment of the layout diagram 200' shown in FIG. 2B. As shown in FIG. 4A, similar elements have a same reference number as shown in FIG. 2B. One or more of the layout patterns described herein are usable to prepare a set of masks usable for manufacturing a memory cell in an integrated circuit. The layout diagram 400 of the semiconductor device is a basis to be modified to form other layout structures, such as those described herein, e.g., FIGS. 2B, 3B and 6A-6F.

Layout diagram 400 includes active regions 404a and 404b, gate structures 408a, 408b, 408c and 408d, isolation region 404, second conductive feature 430 and third conductive features 432a and 432b.

Active regions 404a and 404b are an embodiment of active region 104a shown in FIG. 2B. Gate structures 408a, 408b, 408c and 408d are an embodiment of gate structures 108a, 108b, 108c and 108d shown in FIG. 1. Isolation region 404 is an embodiment of isolation structure 104b shown in FIG. 1. Second conductive feature 430 is an embodiment of second conductive feature 130 shown in FIG. 1. Third conductive features 432a and 432b are an embodiment of third conductive feature 132 shown in FIG. 1.

Active regions 404a and 404b extend in the width direction (i.e., in the horizontal direction of FIG. 4A). Active region 404a is electrically isolated from the active region 404b by isolation region 404. In some embodiments, active regions 404a and 404b include p or n doped materials.

The gate structures 408a, 408b, 408c and 408d extend in the height direction (i.e., in the vertical direction of FIG. 4A). The gate structures 408a, 408b, 408c and 408d extend over the active regions 404a and 404b, and across the isolation structure 404. The gate structures 408a, 408b, 408c and 408d are electrically isolated from each other by isolation region 404.

The second conductive feature 430 (e.g., MP) extends in the width direction (i.e., in the horizontal direction of FIG. 4A). In some embodiments, second conductive feature 430 (e.g., MP) is electrically connected to the gate structure 408c. In some embodiments, second conductive feature 430 (e.g., MP) is directly connected to the gate structure 408c. In some embodiments, second conductive feature 430 (e.g., MP) is arranged to extend across isolation region 404.

The third conductive feature 432a (e.g., MD2) extends in the width direction (i.e., in the horizontal direction of FIG. 4A). In some embodiments, third conductive feature 432a (e.g., MD2) is electrically connected to the source/drain features (e.g., active region 404a) of the gate structure 408c.

In some embodiments, third conductive feature 432a (e.g., MD2) extends across active regions 404a and 404b. In some embodiments, third conductive feature 432a (e.g., MD2) is arranged to extend over active region 404a without being electrically connected to the gate structure 408c.

The third conductive feature 432b (e.g., MD2) extends in the height direction (i.e., in the vertical direction of FIG. 4A). In some embodiments, third conductive feature 432b (e.g., MD2) is electrically connected to the source/drain feature (e.g., active region 404a) and the source/drain feature (e.g., active region 404b). In some embodiments, third conductive feature 432b (e.g., MD2) is arranged to extend across isolation region 404.

Figure 4B:
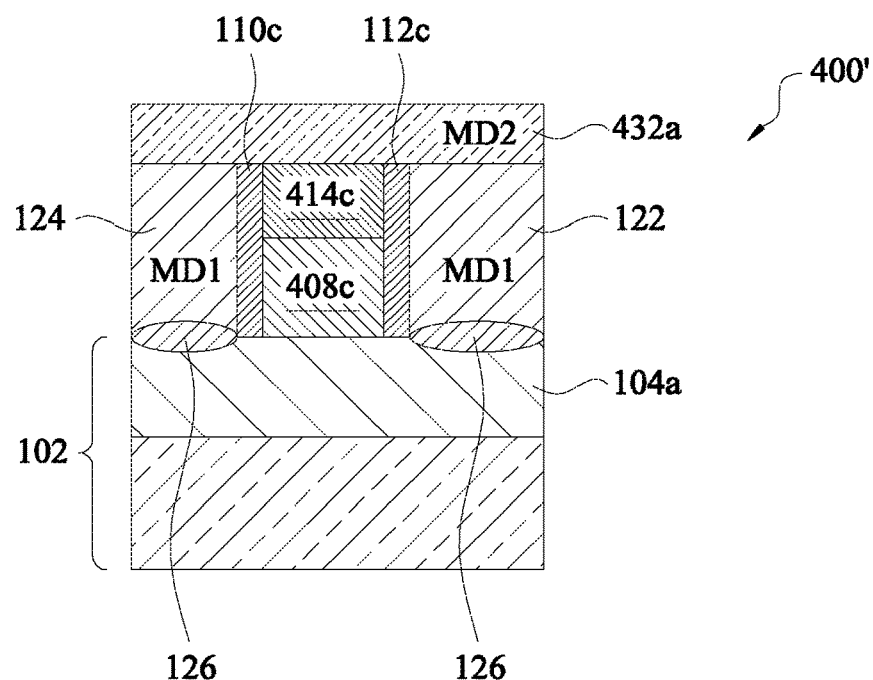
FIG. 4B is a schematic cross-sectional view of a portion of the semiconductor device shown in FIG. 4A accordance with one or more embodiments.

FIG. 4B is a schematic cross-sectional view of a portion of the semiconductor device 400' shown in FIG. 4A in accordance with one or more embodiments. The schematic cross-sectional diagram 400' of FIG. 4B is a cross-sectional view of a portion of the layout 400 shown in FIG. 4A, and includes similar elements having a same reference number as shown in FIG. 4A. Semiconductor device 400' is an embodiment of semiconductor device 100 shown in FIG. 1 with similar elements. As shown in FIG. 4B, similar elements have a same reference number as shown in FIG. 1.

Third conductive feature 432a (e.g., MD2) is over gate structure 408c, insulating layer 414c and first conductive features 122 and 124 (e.g., MD1). As shown in FIG. 4B, third conductive feature 432a (e.g., MD2) is arranged to extend over active region 404a without being electrically connected to the gate structure 408c. As shown in FIG. 4B, third conductive feature 432a (e.g., MD2) is electrically isolated from the gate structure 408c by insulating layer 414c. As shown in FIG. 4B, third conductive feature 432a (e.g., MD2) is electrically connected to first conductive features 122 and 124 (e.g., MD1), without being electrically connected to the gate structure 408c.

Figure 5:
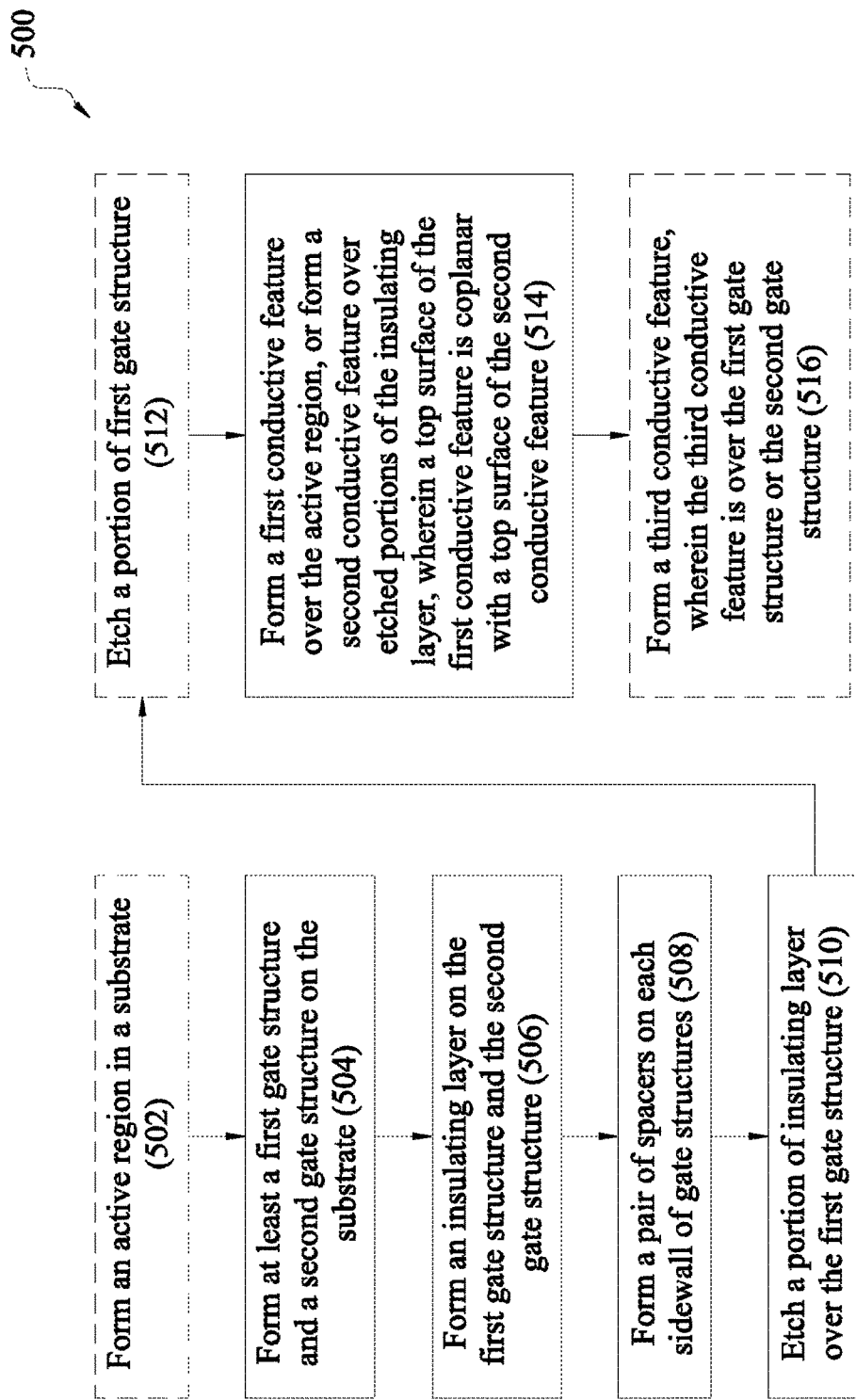
FIG. 5 is a flow chart of a method of manufacturing a semiconductor device in accordance with some embodiments.

FIG. 5 is a flow chart of a method 500 of manufacturing a semiconductor device 600F (shown in FIG. 6F), in accordance with some embodiments. FIGS. 6A-6F are schematic cross-sectional views of the semiconductor device 600F at various manufacturing stages, in accordance with some embodiments. Semiconductor device 600F is an embodiment of semiconductor device 100 shown in FIG. 1 with similar elements. As shown in FIGS. 6A-6F, similar elements have a same reference number as shown in FIG. 1.

One or more effects discussed herein with respect to FIGS. 1-4 is/are obtainable in the manufacturing method 500 in accordance with some embodiments.

At operation 502 of the method 500, an active region 104a is formed in a substrate 102. The substrate 102 comprises, in at least one embodiment, a silicon substrate. The substrate 102 comprises, in at least one embodiment, silicon germanium (SiGe), Gallium arsenic, or other suitable semiconductor materials. In at least one embodiment, the isolation structures 104b (e.g., shallow trench isolation (STI) regions) are formed in the substrate 102 for isolating active area 104a in the substrate 102. Example materials of the STI regions 104b include, but are not limited to, silicon oxide, silicon nitride, silicon oxynitride, fluoride-doped silicate, and/or any other low k dielectric materials. In some embodiments, the substrate 102 further includes one or more other features, such as various doped regions, a buried layer, and/or an epitaxy (epi) layer. In some embodiments, the substrate 102 comprises a semiconductor on insulator, such as silicon on insulator (SOI). In some embodiments, the substrate 102 includes a doped epi layer, a gradient semiconductor layer, and/or a semiconductor layer overlying another semiconductor layer of a different type such as a silicon layer on a silicon germanium layer. In some embodiments, operation 502 is optional, where a semiconductor device having an active region is already formed.

Figure 6A:
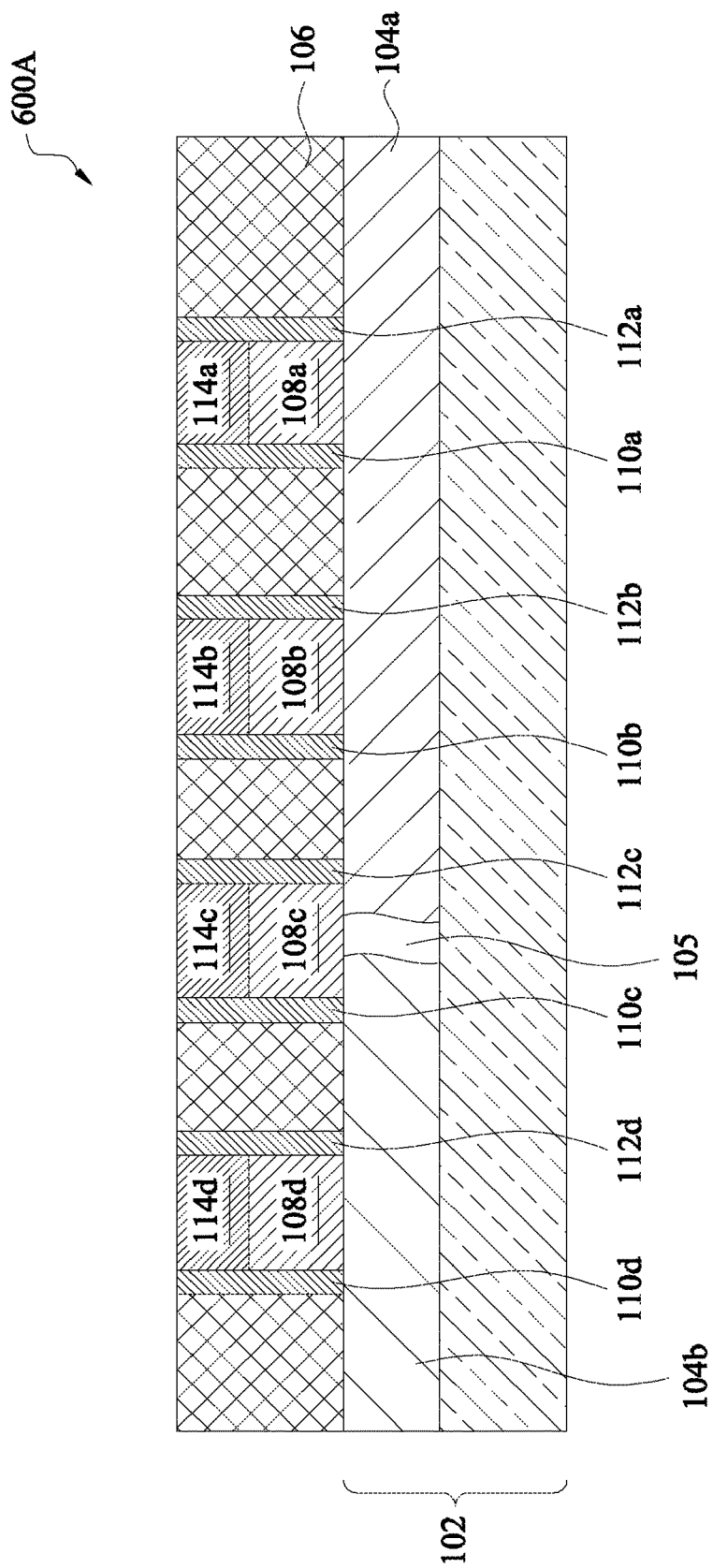
FIGS. 6A-6F are schematic cross-sectional views of the semiconductor device of the method shown in FIG. 5 at various manufacturing stages in accordance with some embodiments.
Figure 6B:
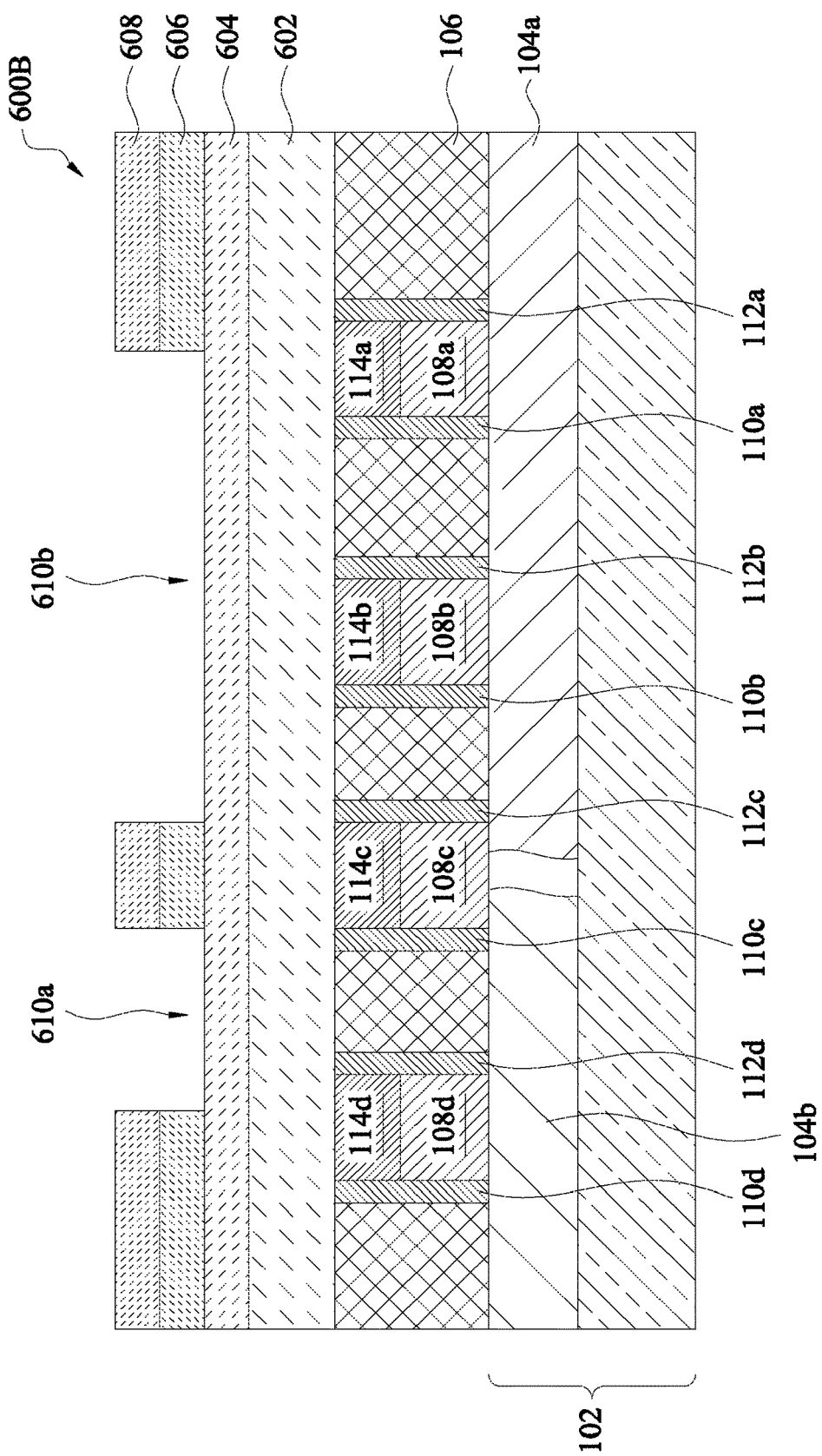

At operation 504 of the method 500, at least a first gate structure 108a and a second gate structure 108b are formed on the substrate 102. In some embodiments, in operation 504, a first gate structure 108a, a second gate structure 108b, a third gate structure 108c and a fourth gate structure 108d are formed on the substrate 102 (as shown in FIG. 6A).

In some embodiments, the gate structures 108a, 108b, 108c and 108d are formed over the substrate 102 including a gate dielectric (not shown) on the substrate 102. Example materials of the gate dielectric include, but are not limited to, a high-k dielectric layer, an interfacial layer, and/or combinations thereof. Example materials for the high-k dielectric layer include, but are not limited to, silicon nitride, silicon oxynitride, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO$_2$—Al$_2$O$_3$) alloy, other suitable high-k dielectric materials, and/or combinations thereof. The thickness of the high-k dielectric layer is in the range of, for instance, about 5 angstroms (Å) to about 40 Å. In some embodiments, the gate dielectric is formed over the substrate 102 by atomic layer deposition (ALD) or other suitable techniques.

In some embodiments, the gate structures 108a, 108b, 108c and 108d further include a gate electrode (not shown) formed over the gate dielectric (not shown). The thickness of the gate electrode ranges, for instance, from about 10 to about 500 Å. The gate electrode is formed of poly-silicon or metal. In one or more embodiments, the gate electrode comprises Al, AlTi, Ti, TiN, TaN, Ta, TaC, TaSiN, W, WN, MoN, and/or other suitable conductive materials. In some embodiments, the gate electrode is formed by chemical vapor deposition (CVD), physical vapor deposition (PVD or sputtering), plating, atomic layer deposition (ALD), and/or other suitable processes.

At operation 506 of the method 500, an insulating layer (e.g., shown in FIG. 5A as insulating layer 114a and 114b) is formed on at least a first gate structure 108a and a second gate structure 108b. In some embodiments, in operation 506, an insulating layer (e.g., shown in FIG. 5A as insulating layer 114a, 114b, 114c and 114d) is formed on gate structures 108a, 108b, 108c and 108d. In some embodiments, insulating layer 114a, 114b, 114c and 114d comprises a hard mask 521. In some embodiments, the insulating layer 114a, 114b, 114c and 114d includes silicon nitride, silicon oxynitride, silicon carbide or other suitable materials. In some embodiments, the insulating layer 114a, 114b, 114c and 114d is formed, in at least one embodiment, by a deposition process or any suitable methods, and used as a mask to pattern the gate structures 108a, 108b, 108c and 108d.

At operation 508 of the method 500, a pair of spacers (e.g., pair of first spacers 110a and 112a, pair of second spacers 110b and 112b, pair of third spacers 110c and 112c and pair of fourth spacers 110d and 112d) are formed on each sidewall of the gate structures (e.g., first gate structure 108a, second gate structure 108b, gate structures 108c and 108d).

The pair of spacers (e.g., pair of first spacers 110a and 112a, pair of second spacers 110b and 112b, pair of third spacers 110c and 112c and pair of fourth spacers 110d and 112d) are formed on sidewalls of the gate structures (e.g., first gate structure 108a, second gate structure 108b, gate structures 108c and 108d). The pair of spacers (e.g., pair of first spacers 110a and 112a, pair of second spacers 110b and 112b, pair of third spacers 110c and 112c and pair of fourth spacers 110d and 112d) comprises, for instance, a dielectric layer. In one or more embodiments, the pair of spacers (e.g., pair of first spacers 110a and 112a, pair of second spacers 110b and 112b, pair of third spacers 110c and 112c and pair of fourth spacers 110d and 112d) is formed of silicon nitride. In some embodiments, the pair of spacers (e.g., pair of first spacers 110a and 112a, pair of second spacers 110b and 112b, pair of third spacers 110c and 112c and pair of fourth spacers 110d and 112d) includes oxynitride. In some embodiments, the pair of spacers (e.g., pair of first spacers 110a and 112a, pair of second spacers 110b and 112b, pair of third spacers 110c and 112c and pair of fourth spacers 110d and 112d) is formed of silicon carbide. In some embodiments, the pair of spacers (e.g., pair of first spacers 110a and 112a, pair of second spacers 110b and 112b, pair of third spacers 110c and 112c and pair of fourth spacers 110d and 112d) contains an impurity, such as boron, carbon, fluorine, or combinations thereof. In some embodiments, the pair of spacers (e.g., pair of first spacers 110a and 112a, pair of second spacers 110b and 112b, pair of third spacers 110c and 112c and pair of fourth spacers 110d and 112d) is formed by suitable methods. First, a layer for the pair of spacers (e.g., pair of first spacers 110a and 112a, pair of second spacers 110b and 112b, pair of third spacers 110c and 112c and pair of fourth spacers 110d and 112d) is deposited over the gate structure (e.g., first gate structure 108a, second gate structure 108b, gate structures 108c and 108d) and the substrate 102, for example, by plasma enhanced chemical vapor deposition (PECVD), low-pressure chemical vapor deposition (LPCVD), sub-atmospheric chemical vapor deposition (SACVD), atomic layer deposition (ALD), and the like. The layer for the pair of spacers (e.g., pair of first spacers 110a and 112a, pair of second spacers 110b and 112b, pair of third spacers 110c and 112c and pair of fourth spacers 110d and 112d) is formed to have a suitable thickness, e.g., in the range of about 50 Å to about 400 Å. Further, the deposited layer for the pair of spacers (e.g., pair of first spacers 110a and 112a, pair of second spacers 110b and 112b, pair of third spacers 110c and 112c and pair of fourth spacers 110d and 112d) is patterned to form the pair of spacers (e.g., pair of first spacers 110a and 112a, pair of second spacers 110b and 112b, pair of third spacers 110c and 112c and pair of fourth spacers 110d and 112d) in contact or adjacent to the sidewalls of the gate structure (e.g., first gate structure 108a, second gate structure 108b, gate structures 108c and 108d). The patterning is performed, in at least one embodiment, by suitable techniques, such as a wet etch process, a dry etch process, or combinations thereof. In one or more embodiments, the patterning to form the pair of spacers (e.g., pair of first spacers 110a and 112a, pair of second spacers 110b and 112b, pair of third spacers 110c and 112c and pair of fourth spacers 110d and 112d) is conducted by an anisotropic dry etching process.

The above description where the gate structure (e.g., first gate structure 108a, second gate structure 108b, gate structures 108c and 108d) is formed before the spacer (e.g., pair of first spacers 110a and 112a, pair of second spacers 110b and 112b, pair of third spacers 110c and 112c and pair of fourth spacers 110d and 112d) is referred to as a gate-first process. In an alternative, gate-last process, the same or similar steps of the gate-first process is performed to form a dummy gate, e.g., dummy poly-silicon, and the spacer (e.g., pair of first spacers 110a and 112a, pair of second spacers 110b and 112b, pair of third spacers 110c and 112c and pair of fourth spacers 110d and 112d). The dummy gate is replaced afterwards with a suitable metal or conductive material to obtain the gate structure (e.g., first gate structure 108a, second gate structure 108b, gate structures 108c and 108d).

Further, source and drain features are formed in an active area 104a of the substrate 102 by using the gate structure (e.g., first gate structure 108a, second gate structure 108b, gate structures 108c and 108d) and the spacer (e.g., pair of first spacers 110a and 112a, pair of second spacers 110b and 112b, pair of third spacers 110c and 112c and pair of fourth spacers 110d and 112d) as a mask. Thus, the active area 104a includes the gate structure (e.g., first gate structure 108a, second gate structure 108b, gate structures 108c and 108d) and the source and drain features adjacent the gate structure (e.g., first gate structure 108a, second gate structure 108b, gate structures 108c and 108d). For example, the formation of the source/drain features is performed by an ion implantation or a diffusion process. Depending on the type of the semiconductor device, the source/drain features are doped with p-type dopants, such as boron or $BF_2$, n-type dopants, such as phosphorus or arsenic, and/or combinations thereof. In some embodiments, lightly doped source/drain (LDD) regions are formed in the substrate 102 prior to the formation of the spacer (e.g., pair of first spacers 110a and 112a, pair of second spacers 110b and 112b, pair of third spacers 110c and 112c and pair of fourth spacers 110d and 112d), by one or more implantation processes, such as an ion implantation process.

In some embodiments, an inter-layer dielectric (ILD) layer 106 is formed over the substrate 102. A resulting semiconductor device structure 600A is obtained as shown in FIG. 6A. In some embodiments, the resulting semiconductor device structure 600A as shown in FIG. 6A is a useful intermediary which is connected to other materials for further processing. The ILD layer 106 is also referred to herein as an ILD0 layer. Example materials of the ILD layer 106 include, but are not limited to, SiNx, SiOx, SiON, SiC, SiBN, SiCBN, or combinations thereof. In at least one embodiment, the ILD layer 106 is formed using high-density plasma (HDP), although other methods such as Sub-Atmospheric Pressure Chemical Vapor Deposition (SACVD), Lower Pressure Chemical Vapor Deposition (LPCVD), ALD, Plasma enhanced ALD (PEALD), Plasma enhanced CVD (PECVD), Monolayer Deposition (MLD), Plasma Impulse CVD (PICVD), spin-on, or the like are used in various embodiments.

In some embodiments, a further ILD layer 602, referred to herein as an ILD1 layer, is formed over the ILD layer 106. The ILD layer 602 is also referred to herein as an ILD0 layer. Example materials of the ILD layer 602 include, but are not limited to, SiNx, SiOx, SiON, SiC, SiBN, SiCBN, or combinations thereof. In at least one embodiment, the ILD layer 106 is formed using HDP, although other methods such as SACVD, LPCVD, ALD, PEALD, PECVD, MLD, PICVD, spin-on, or the like are used in various embodiments.

In some embodiments, a hard mask layer 604 is deposited over the ILD layer 602. In some embodiments, the hard mask layer 604 includes silicon nitride, silicon oxynitride, silicon carbide or other suitable materials. In some embodiments, the hard mask layer 604 is formed, in at least one embodiment, by a deposition process or any suitable methods, and used as a mask to pattern the first contact features 120, 122 and 124 (as shown in FIG. 600E).

In some embodiments, an anti-reflective coating (ARC) layer 606 is deposited over the hard mask layer 604. In some embodiments, the ARC layer 606 is a bottom ARC (BARC) layer. In some embodiments, the ARC layer 606 includes a single layer or multiple layers. In some embodiments, the ARC layer 606 includes a dielectric material including an oxide; an organic polymer material, low-k dielectrics; high-k dielectrics; any other suitable material; or combinations thereof. In some embodiments, the ARC layer 606 is formed using any appropriate method, including in this case a spin-on coater or other suitable processes.

In some embodiments, a photoresist layer 608 is deposited over the ARC layer 606. In some embodiments, the photoresist layer 608 is used to pattern the hard mask layer 604 to define, at least in part, the dimensions of the first contact features 120, 122, and 124. In some embodiments, the photoresist layer 608 and the ARC layer 606 are selectively removed from regions 610a and 610b over the top surface of the hard mask layer 604. A resulting semiconductor device structure 500B is obtained as shown in FIG. 5B.

Figure 6C:
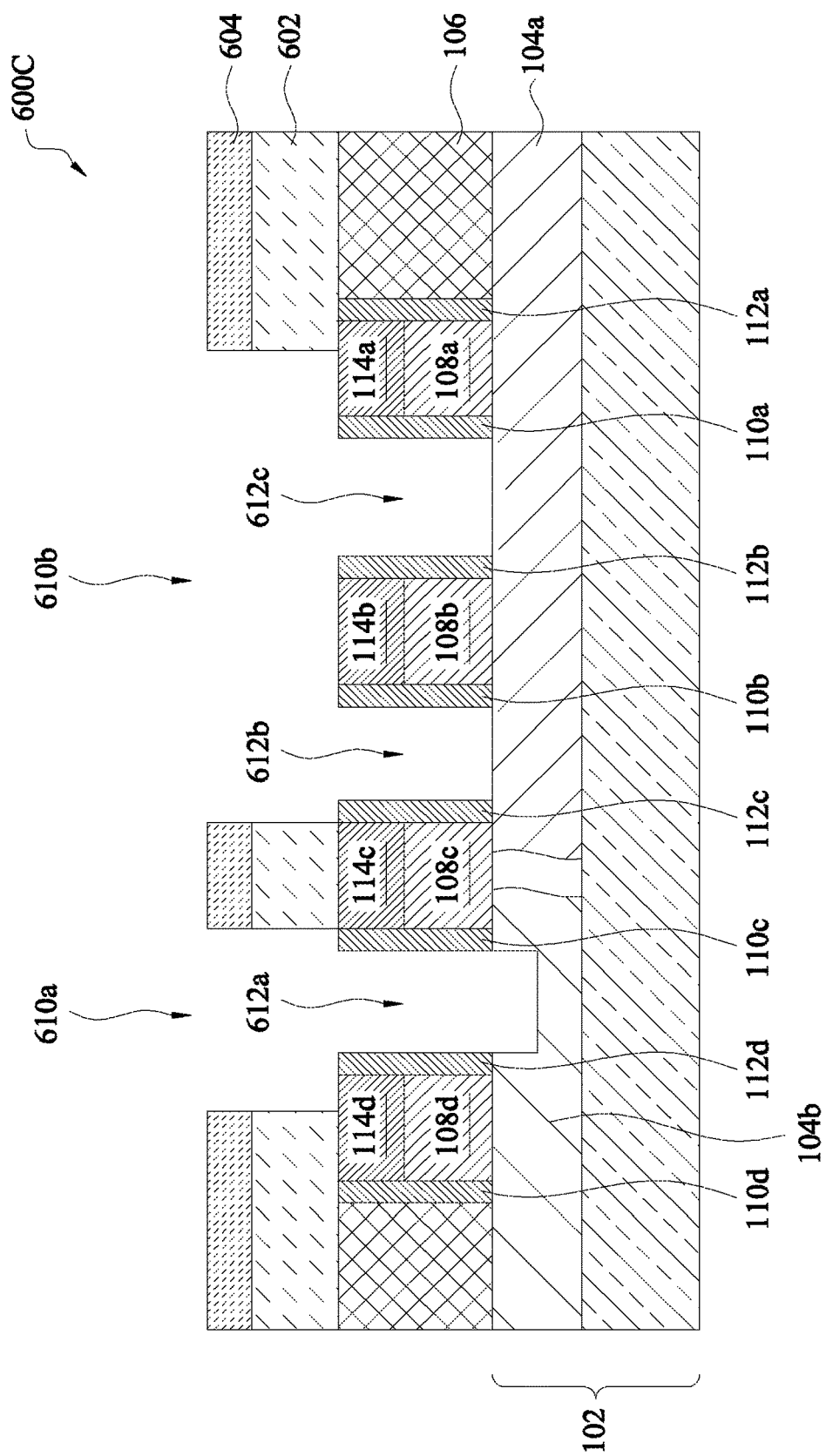

In some embodiments, the remaining ARC layer 606, photoresist layer 608 and a portion of the hard mask layer 604 uncovered by both the ARC layer 606 and photoresist layer 608 (e.g., regions 610a and 610b) are selectively removed, e.g., by a photolithography process followed by an etching process, to expose the underlying first conductive regions 612a, 612b and 612c. In some embodiments, the etching process removes portions of the ILD layer 106 located between at least two or more gate structures (e.g., gate structure 108a, 108b, 108c or 108d) forming regions 612b and 612c. In some embodiments, the etching process removes portions of the STI region (e.g., isolation structure 104b) forming region 612a. The hard mask layer 604 remains over the ILD layer 106 and a portion of ILD layer 602 so as not to expose the underlying ILD layer 106 to the etch process. A resulting semiconductor device structure 600C is obtained as shown in FIG. 6C. In some embodiments, the resulting semiconductor device structure 600C as shown in FIG. 6C is a useful intermediary which is connected to other materials for further processing.

At operation 510 of the method 500, a portion 612d of insulating layer (e.g., insulating layer 114a, 114b, 114c or 114d) over at least one of the gate structures (e.g., gate structure 108a, 108b, 108c or 108d) is etched. In some embodiments, in operation 510, a portion 612d of insulating layer (e.g., insulating layer 114a) over the first gate structure 108a is etched (as shown in FIG. 6C).

Figure 6D:
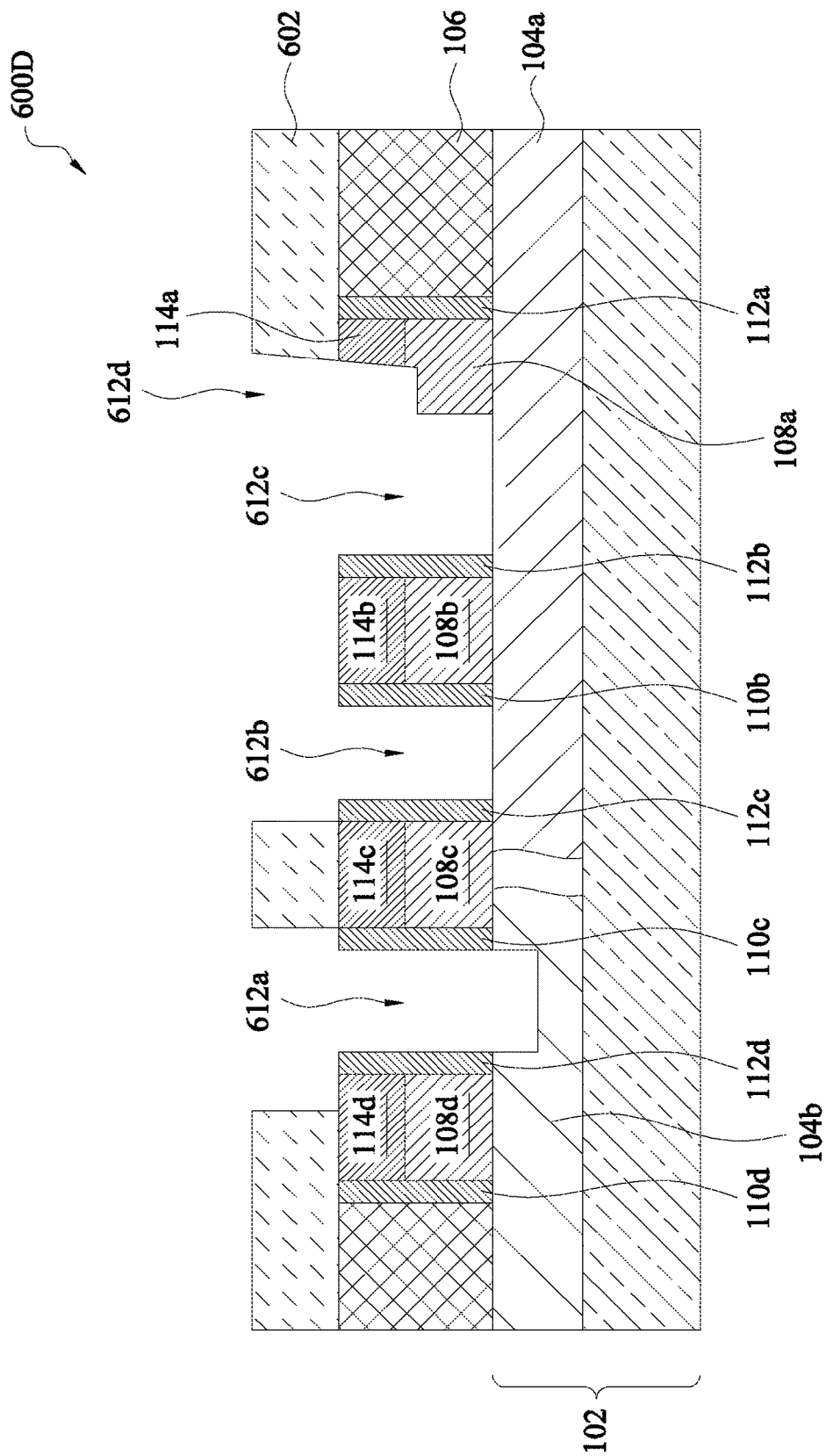

At operation 512 of the method 500, at least a portion of at least one gate structure (e.g., gate structure 108a, 108b, 108c or 108d) is etched exposing the remaining portion of the gate structure (e.g., gate structure 108a, 108b, 108c or 108d). In some embodiments, in operation 512, at least a portion of the first gate structure (e.g., gate structure 108a) is chemically etched (as shown in FIG. 6D) exposing the remaining portion of the first gate structure (e.g., gate structure 108a). In some embodiments, operation 512 is optional. A resulting semiconductor device structure 600D is obtained as shown in FIG. 6D. In some embodiments, the resulting semiconductor device structure 600D as shown in FIG. 6D is a useful intermediary which is connected to other materials for further processing.

In some embodiments, before forming the first conductive features 120, 122 and 124 (e.g., the MD1 layer), a silicidation (e.g., self-aligned silicidation) process or a suitable method is performed to provide the top surfaces of the source/drain features (e.g., active region 104a) with silicided regions 126 as contact features. For example, a metal layer is blanket-deposited over the exposed source/drain features (e.g., active region 104a), and then an annealing step is performed to form metal silicide layers on the source/drain features (e.g., active region 104a). Unreacted metal is subsequently removed, e.g., by a wet chemical etch.

Figure 6E:
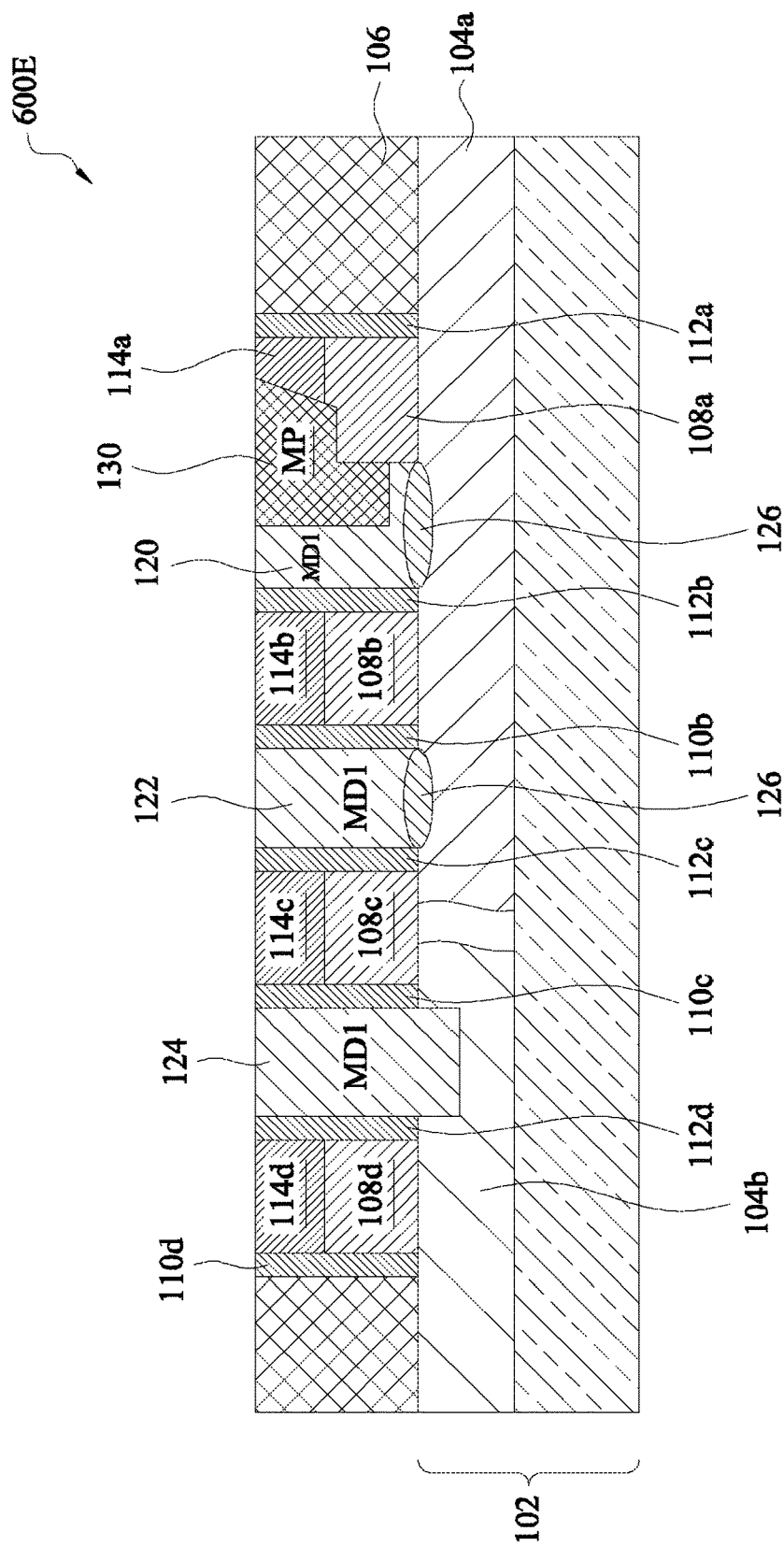

At operation 514 of the method 500, a first conductive feature 120, 122 or 124 (e.g., MD1) is formed over the active region 104a, or a second conductive feature 130 (e.g., MP) is formed over a portion 612d of the etched insulating layer (e.g., insulating layer 114a, 114b, 114c or 114d) to be in direct electrical contact with the active region 104a. A resulting semiconductor device structure 600E is obtained as shown in FIG. 6E. For example, as shown in FIG. 6E, a conductive material is formed to fill the openings 612a, 612b and 612c, and then planarized, to obtain corresponding first conductive feature 120, 122 or 124 (e.g., MD1) or second conductive feature 130 (e.g., MP). In some embodiments, the planarizing process comprises, for example, a chemical mechanical polish (CMP) process.

In the example configuration illustrated in FIG. 5E, the first conductive feature 124 extends at least partially into the STI region (e.g., isolating structure 104b), whereas first conductive features 120 and 122 make electrical connection with the corresponding exposed source/drain features (e.g., active region 104a). In some embodiments, the first conductive feature 120, 122 or 124 (e.g., MD1) and the second conductive feature 130 (e.g., MP) are formed of the same conductive materials. In some embodiments, the first conductive feature 120, 122 or 124 (e.g., MD1) and the second conductive feature 130 (e.g., MP) are formed of different conductive materials. In some embodiments, a top surface of the first conductive feature 120, 122 or 124 (e.g., MD1) is substantially coplanar with a top surface of the second conductive feature 130 (e.g., MP). In some embodiments, the first conductive feature 120, 122 or 124 (e.g., MD1) or the second conductive feature 130 (e.g., MP) is formed of Tungsten.

In some embodiments, the second conductive feature 130 is in direct electrical contact with the gate structure 108a. In some embodiments, the second conductive feature 130 is in direct electrical contact with the corresponding first conductive feature 120. The illustrations shown in FIG. 5E are exemplary, and the number of second conductive features 130 varies. In some embodiments, each second conductive feature 130 is electrically connected to more than one first conductive feature. In some embodiments, the top surface of the first conductive feature 120 is coplanar with the top surface of the second conductive feature 130. In some embodiments, the second conductive feature 130 has a tapered shape. In some embodiments, the second conductive feature 130 has an L-shape. In some embodiments, the second conductive feature 130 has a U-shape. In some embodiments, a portion of the second conductive feature 130 is embedded in the first conductive feature 120. In some embodiments, a material of the second conductive feature 130 is substantially similar to the material of the first conductive feature 120. In some embodiments, a portion of the second conductive feature 130 is embedded between the first conductive feature 120, the gate structure 108a and the pair of first spacers 110a and 112a. In some embodiments, the second conductive feature 130 is directly on the first spacer 110a.

In some embodiments, a further ILD layer 134, referred to herein as an ILD2 layer, is formed over the planarized first conductive feature 120, 122 or 124 (e.g., MD1) or second conductive feature 130 (e.g., MP). Example materials of the ILD layer 134 include, but are not limited to, $SiN_x$, $SiO_x$, SiON, SiC, SiBN, SiCBN, or combinations thereof. In at least one embodiment, the ILD layer 134 is formed using HDP, although other methods such as SACVD, LPCVD, ALD, PEALD, PECVD, MLD, PICVD, spin-on, or the like are used in various embodiments. In some embodiments, a hard mask layer (not shown) is formed over the ILD layer 134. In some embodiments, contact openings are formed in the ILD layer 134 by an etching process to expose underlying first conductive feature 120, 122 or 124 (e.g., MD1) or second conductive feature 130 (e.g., MP).

Figure 6F:
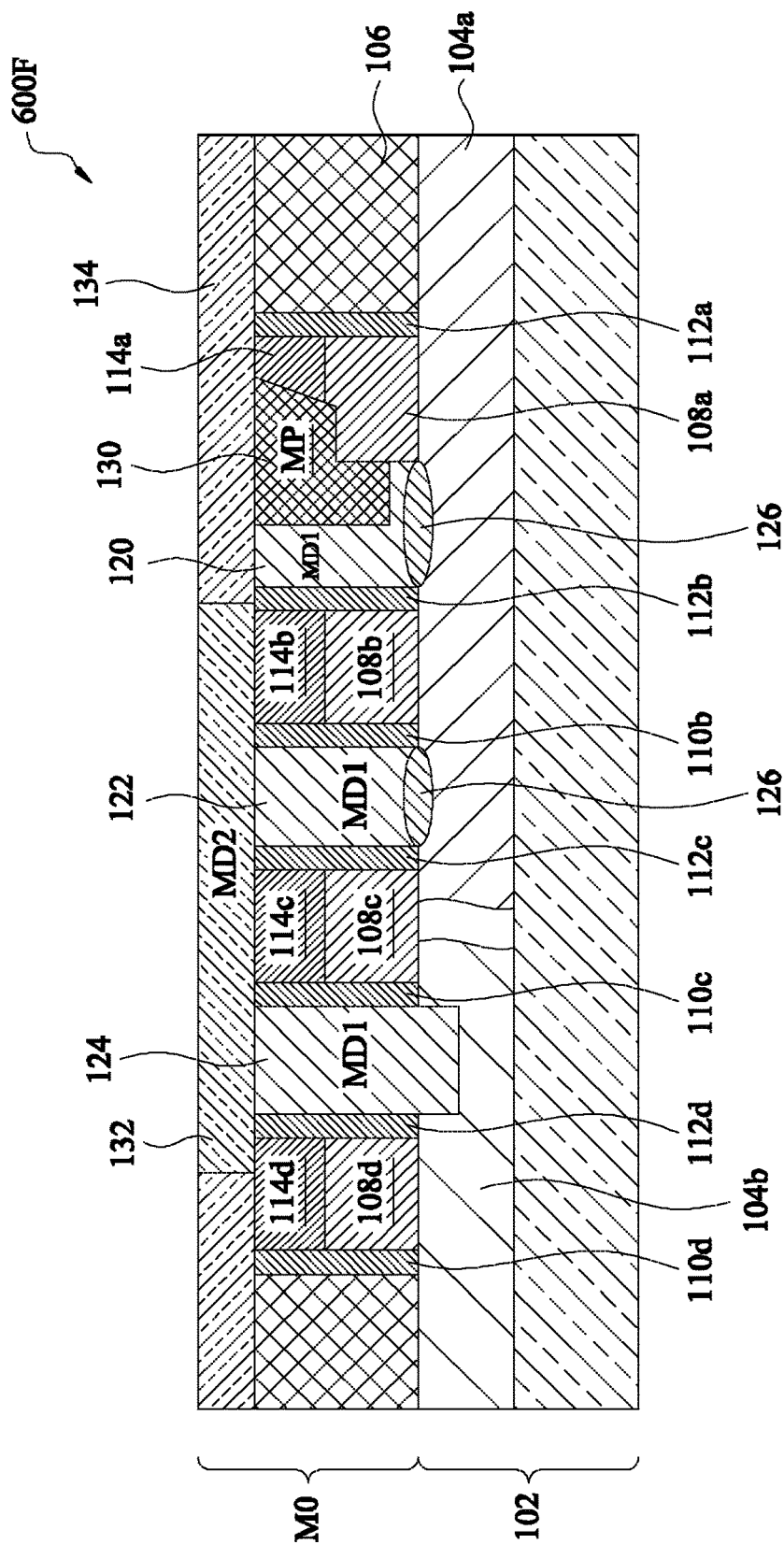

At operation 516 of the method 500, third conductive feature 132 (e.g., MD2) is formed over the first conductive feature 120, 122 or 124 (e.g., MD1) or second conductive feature 130 (e.g., MP). In some embodiments, the third conductive feature 132 is formed over the gate structures (e.g., first gate structure 108a or second gate structure 108b). A conductive material is formed to fill the contact openings, to obtain third conductive feature 132 (e.g., MD2). A resulting semiconductor device structure 600F is obtained as shown in FIG. 6F.

In some embodiments, the first conductive feature 120, 122 or 124 (e.g., MD1) and the third conductive feature 132 (e.g., MD2) are formed of different conductive materials. In some embodiments, the first conductive feature 120, 122 or 124 (e.g., MD1) and the third conductive feature 132 (e.g., MD2) are formed of the same conductive material. In some embodiments, the first conductive feature 120, 122 or 124 (e.g., MD1) and the third conductive feature 132 (e.g., MD2) are formed of tungsten. In some embodiments, the formation of at least one of the first conductive feature 120, 122 or 124 (e.g., MD1) or the third conductive feature 132 (e.g., MD2) includes depositing a glue (or seed) metal layer before filling the corresponding conductive material(s) in the corresponding openings.

The above method(s) include(s) example operations, but the operations in some embodiments are not performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In summary, one or more embodiments implement at least a part of an electrical connection between elements of a semiconductor device in the M0 layer. In some embodiments, the second conductive feature (e.g., second conductive feature 130, 230 or 330) is configured to provide a larger contact area to one or more connected gate structures (e.g., gate structure 108a, 108b, 108c or 108d) when compared with similar conductive features positioned above the gate structure (and located above the first contact feature MD1). In some embodiments, second conductive feature 130 (e.g., MP) is arranged to extend across active region 104a. In some embodiments, second conductive feature 130 (e.g., MP) is arranged to extend across one or more isolation regions (e.g., isolation structure 104b or 204). In some embodiments, third conductive feature 132 (e.g., MD2) is arranged to extend across one or more isolation regions (e.g., isolation structure 104b or 204). In some embodiments, third conductive feature 132 (e.g., MD2) is arranged to extend across active regions 104a. In some embodiments, third conductive feature 132 (e.g., MD2) is arranged to extend over active region 104a without being electrically connected to one or more gate structures (e.g., gate structure 108a, 108b, 108c or 108d). As a result, one or more of manufacturing time, manufacturing cost, manufacturing material, and size of the semiconductor device is/are reduced compared to the other approaches.

In some embodiments, a semiconductor device includes a substrate having an active region, a first gate structure over a top surface of the substrate, a second gate structure over the top surface of the substrate, a pair of first spacers on each sidewall of the first gate structure, a pair of second spacers on each sidewall of the second gate structure, an insulating layer over at least the first gate structure, a first conductive feature over the active region and a second conductive feature over the substrate. Further, the second gate structure is adjacent to the first gate structure and a top surface of the first conductive feature is coplanar with a top surface of the second conductive feature.

In some embodiments, an integrated circuit comprising a substrate comprising a source feature, and a drain feature, a first gate structure over a top surface of the substrate, wherein the first gate structure is between the source feature and the drain feature, a second gate structure over the top surface of the substrate, wherein the second gate structure is adjacent to the first gate structure and the source feature, a pair of first spacers on each sidewall of the first gate structure, a pair of second spacers on each sidewall of the second gate structure, an insulating layer over at least the first gate structure, a first conductive feature over the source feature or the drain feature, wherein a top surface of the first conductive feature is coplanar with a top surface of the insulating layer, a second conductive feature over the substrate, and a third conductive feature, wherein the third conductive feature is over the first conductive feature or the second conductive feature.

In a method of manufacturing a semiconductor device in accordance with some embodiments, the method comprising forming an active region in a substrate, forming a first gate structure and a second gate structure on a substrate, wherein the second gate structure is adjacent to the first gate structure, forming an insulating layer on the first gate structure and the second gate structure, forming a pair of first spacers on each sidewall of the first gate structure, forming a pair of second spacers on each sidewall of the second gate structure and forming a first conductive feature over the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having an active region;
   a first gate structure over a top surface of the substrate;
   a second gate structure over the top surface of the substrate, wherein the second gate structure is adjacent to the first gate structure;
   a pair of first spacers on each sidewall of the first gate structure;
   a pair of second spacers on each sidewall of the second gate structure;
   an insulating layer over the first gate structure;
   a first conductive feature over the active region; and
   a second conductive feature over the substrate, wherein a top surface of the first conductive feature is coplanar with a top surface of the second conductive feature and a top surface of the insulating layer over the first gate structure, the second conductive feature is over and physically contacting one spacer of the pair of first spacers.

2. The semiconductor device of claim 1, further comprising a third conductive feature, wherein the third conductive feature is over the first gate structure or the second gate structure.

3. The semiconductor device of claim 1, wherein the first conductive feature has a tapered shape.

4. The semiconductor device of claim 1, wherein the second conductive feature has an L-shape or a U-shape.

5. The semiconductor device of claim 1, wherein a portion of the second conductive feature is embedded in the first conductive feature.

6. The semiconductor device of claim 1, wherein the first conductive feature or the second conductive feature comprises tungsten.

7. The semiconductor device of claim 1, wherein the insulating layer comprises silicon nitride.

8. The semiconductor device of claim 1 further comprising:
a source feature and a drain feature in the substrate, wherein the first gate structure is between the source feature and the drain feature, wherein the first conductive feature is over the source feature or the drain feature, and wherein a top surface of the first conductive feature is coplanar with a top surface of the insulating layer.

9. A semiconductor device comprising:
a first gate structure over a substrate;
a second gate structure over the substrate;
an insulating layer over at least the first gate structure;
a first conductive feature over and contacting a top surface of the second gate structure, wherein a topmost surface of the first conductive feature is coplanar with a topmost surface of the insulating layer;
a second conductive feature over an active region of the substrate, wherein a portion of the first conductive feature is embedded in the second conductive feature, and wherein the topmost surface of the first conductive features is coplanar with a topmost surface of the second conductive feature;
a pair of first spacers on each sidewall of the first gate structure; and
a pair of second spacers on each sidewall of the second gate structure, the first conductive feature over and physically contacting one spacer of the pair of second spacers.

10. The semiconductor device of claim 9, wherein the insulating layer is between the pair of first spacers.

11. The semiconductor device of claim 9 further comprising:
a third conductive feature over the first gate structure or the second gate structure.

12. The semiconductor device of claim 9, wherein the first conductive feature has an L-shape or a U-shape.

13. A semiconductor device comprising:
a first gate structure and a second gate structure on a substrate;
an active region in the substrate, the active region being between the first and second gate structures;
a first insulating layer on the first gate structure and a second insulating layer on the second gate structure;
a pair of first spacers on each sidewall of the first gate structure and one of the pair of first spacers on a sidewall of the first insulating layer;
a pair of second spacers on each sidewall of the second gate structure and the second insulating layer;
a first conductive feature between the first and second gate structures, the first conductive feature over and electrically coupled to the active region;
a second conductive feature over at least the first gate structure, wherein a portion of a top surface of the second conductive feature is coplanar with a top surface of the second insulating layer over the second gate structure; and
a third conductive feature over the substrate, wherein a top surface of the first conductive feature is coplanar with a top surface of the third conductive feature and a top surface of the first insulating layer on the first gate structure.

14. The semiconductor device of claim 13, further comprising forming a fourth conductive feature, wherein the fourth conductive feature is over the first gate structure or the second gate structure.

15. The semiconductor device of claim 13, wherein the second conductive feature has an L-shape or a U-shape.

16. The semiconductor device of claim 13, wherein a portion of the second conductive feature is embedded in the first conductive feature.

17. The semiconductor device of claim 2, wherein the first conductive feature has a tapered shape.

18. The semiconductor device of claim 9, wherein the insulating layer comprises silicon nitride.

19. The semiconductor device of claim 9, wherein the first conductive feature has a tapered shape.

20. The semiconductor device of claim 9, wherein the first conductive feature or the second conductive feature comprises tungsten.

* * * * *